(12) United States Patent
Nakayama

(10) Patent No.: US 7,745,738 B2
(45) Date of Patent: Jun. 29, 2010

(54) CABLE HOLDER UNIT AND ELECTRONIC DEVICE

(75) Inventor: Takaya Nakayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 561 days.

(21) Appl. No.: 11/785,556

(22) Filed: Apr. 18, 2007

(65) Prior Publication Data

US 2008/0093120 A1 Apr. 24, 2008

(30) Foreign Application Priority Data

Oct. 20, 2006 (JP) ............................. 2006-286455

(51) Int. Cl.
*H02B 1/40* (2006.01)
(52) U.S. Cl. ............... 174/480; 174/154; 174/68.1; 174/64; 174/99 R; 174/72 A; 439/752; 439/468; 248/68.1
(58) Field of Classification Search ............... 174/480, 174/154, 157, 155, 135, 68.1, 64, 99 R, 60, 174/109, 72 A; 439/495, 445, 468, 752; 248/68.1, 74.2, 547
See application file for complete search history.

(56) References Cited

U.S. PATENT DOCUMENTS 4,373,112 A * 2/1983 Mizuno ..................... 174/665
4,544,800 A * 10/1985 Katsuura .................... 174/653
5,213,290 A * 5/1993 Moretti ....................... 248/56
6,226,434 B1 * 5/2001 Koshiyama et al. ......... 385/134
7,071,418 B2 * 7/2006 Brockman et al. .......... 174/154
7,128,598 B2 * 10/2006 Ebert et al. ................. 439/495
7,294,789 B1 * 11/2007 Watthanasintham ......... 174/135

FOREIGN PATENT DOCUMENTS

| JP | 1-133104 | 9/1989 |
| JP | 11-204956 | 7/1999 |
| JP | 2002-100888 | 4/2002 |
| JP | 2005-209702 | 8/2005 |

* cited by examiner

*Primary Examiner*—Dhiru R Patel
(74) *Attorney, Agent, or Firm*—Staas & Halsey LLP

(57) ABSTRACT

A cable holder unit is mounted in an electronic device mounting a plurality of units connected with cables. The cable holder unit has a cable holder assembly having cable holders and a support section for supporting the cable holders and a mounting section for mounting the cable holder assembly. The support section has a groove and a movable section having a projection that is to be inserted into and penetrates through the groove. The mounting section has a pivoting section that enables the support section to pivot and an anchoring section that engages with the projection to stop the support section from pivoting. The cable holder unit also has a preventing section for preventing adjacent units under the mounting section from being pulled out.

5 Claims, 8 Drawing Sheets

US 7,745,738 B2

CABLE HOLDER UNIT AND ELECTRONIC DEVICE

CROSS REFERENCE TO RELATED APPLICATIONS

This application claims the benefit under 35 U.S.C. Section 119 of Japanese Patent Application No. 2006-286455, filed Oct. 20, 2006, which is hereby incorporated by reference in its entirety into this application.

BACKGROUND OF THE INVENTION

1. Field of the Invention

The present invention relates to a cable holder unit for holding a large number of interface cables mounted in an electronic device such as a disk array system.

2. Description of the Related Art

With increasing capacity of hard disks, the damage sustained when such hard disks fail is becoming larger. In order to tackle this problem, RAID (Redundant Array of Inexpensive Disks) technology is being used to prevent loss of data caused when such hard disks fail and also to improve processing performance. In this technology, a plurality of hard disks are combined and managed as one redundant hard disk, and a system using this technology is called as a disk array system. The disk array system is composed of a plurality of disk units for storing data, control modules for controlling reading/writing of data from/to the disk units, channel adapters for controlling communications with a host, and others. A large number of cables such as interface cables between the host and the channel adapters are mounted within a case of the disk array system. When the channel adapters and the control modules are stacked on two rows of upper and lower rows for example, the interface cables between the host and the channel adapters may be obstructive in exchanging units of the control module on the lower row. In such a case, maintenance personnel carry out the exchange of units by pushing the cables aside by hand.

SUMMARY OF THE INVENTION

A cable holder unit of the present invention is mounted in an electronic device mounting a plurality of units connected with cables. The cable holder unit has a cable holder assembly having cable holders and a support section for supporting the cable holders and a mounting section for mounting the cable holder assembly. The support section has a groove and a movable section having a projection that is to be inserted into and penetrates through the groove. The mounting section has a pivoting section that enables the support section to pivot and an anchoring section that engages with the projection to stop the support section from pivoting. This configuration allows the cable holder assembly to be pivoted by releasing the engagement of the projection of the movable section.

As a result, the cables that hang down over the units disposed under the cable holder unit may be eliminated, so that it becomes easy to pull out the units.

DESCRIPTION OF THE PREFERRED EMBODIMENTS

Figure 1:
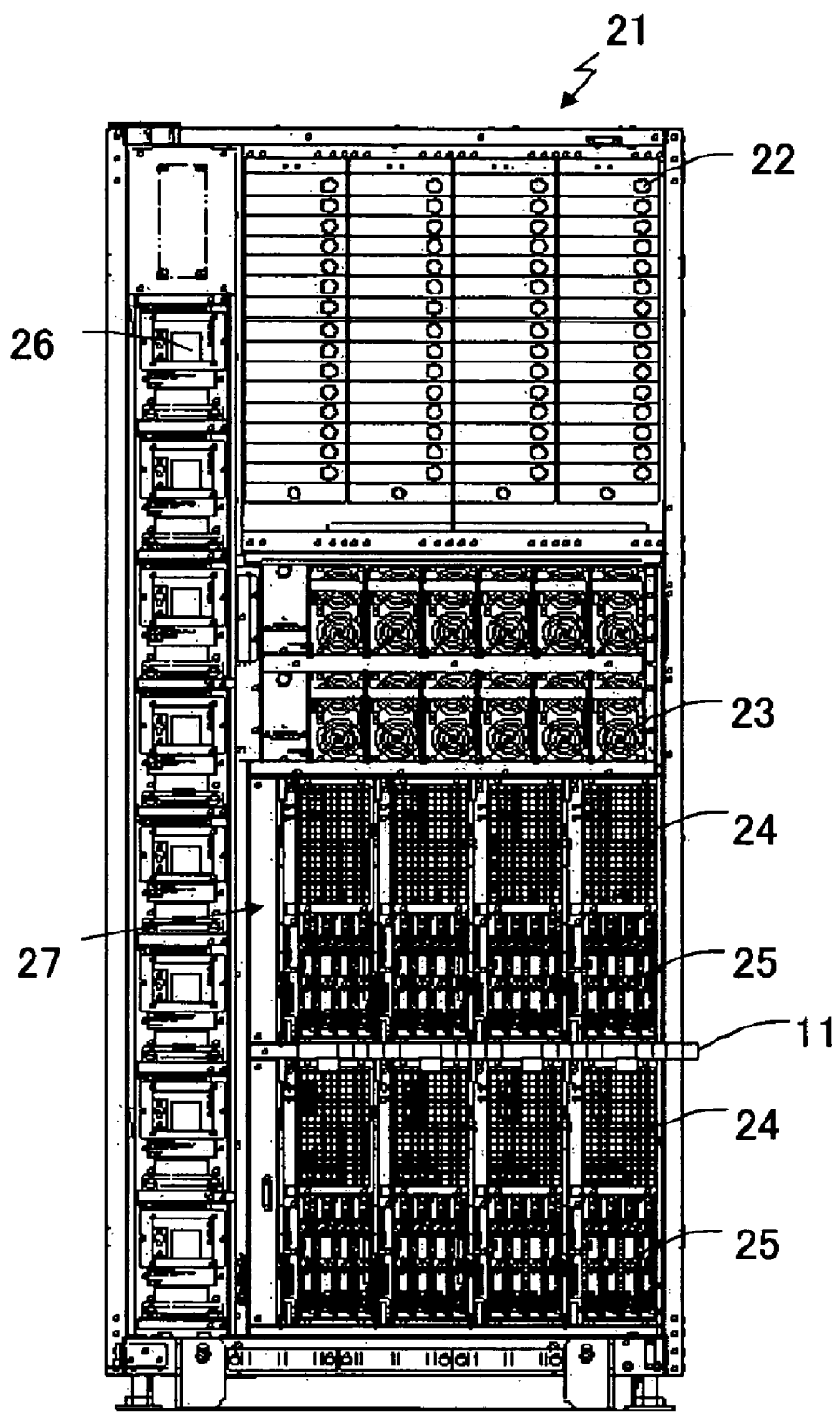
FIG. 1 shows part of a disk array system.

FIG. 1 shows part of a disk array system 21, i.e., the disk array system 21 when a front cover thereof is removed. FIG. 1 shows disk units 22, power modules 23, control modules (hereinafter referred to as CMs) 24, channel adapters (hereinafter referred to as CAs) 25, battery units 26, a shelf 27 mounting the CMs 24 and the CAs 25, a cable holder unit 11 and other components mounted in the disk array system 21.

Several tens of disk units 22 are installed in an upper part of the system. The twelve power modules 23 are provided below the disk units. Then, under the power modules 23, sets of the CMs 24 in an upper part and the CAs 25 in a lower part are mounted in two rows of upper and lower rows of the shelf 27. The cable holder unit 11 is mounted between the two rows of the upper and lower rows of the shelf 27. The battery units 26 are provided on a left side seen from the front side with respect to the disk units 22, the power modules 23, the CMs 24 and the CAs 25.

The disk units 22 are units for storing data. The power modules 23 are power sources of the CMs 24 and the CAs 25. The CM 24 performs read control for sending read data from the disk unit 22 to the host, and others. The CA 25 controls communications with the host. Data from the CA 25 is sent to the corresponding CM 24. Data from the CM 24 is sent to the corresponding CA 25. Four of the CAs 25 are connected to one CM 24. The battery unit 26 supplies power to memories on the CM 24 when its power is interrupted. The shelf 27 is configured so as to have the upper and lower rows to mount two sets of the CMs 24 and the CAs 25. Although not shown, cables 28 for connecting the CAs 25 with the host are mounted. The cable holder unit 11 holds the cables 28 not shown in FIG. 1.

Figure 2:
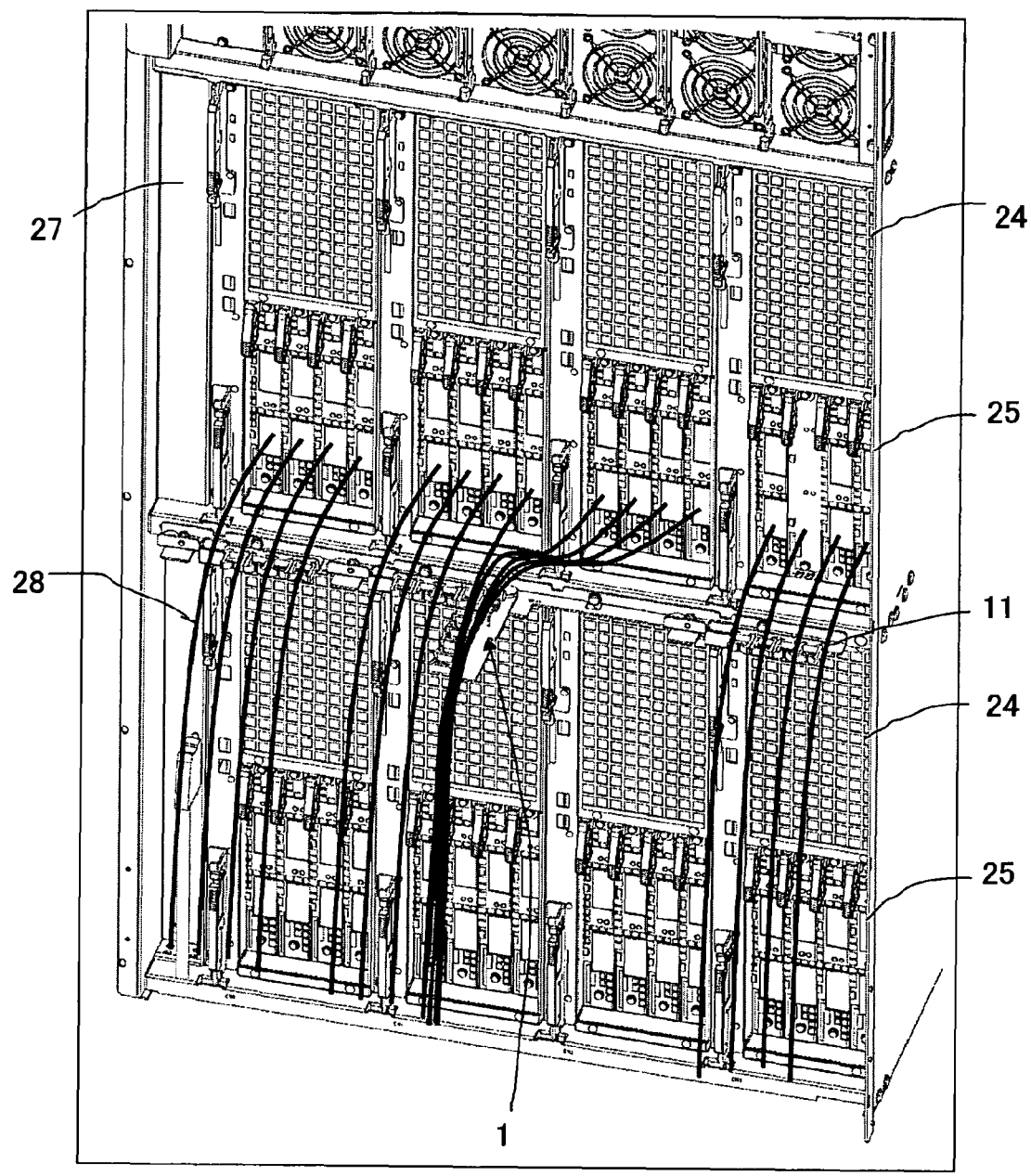
FIG. 2 is a drawing for depicting how to handle cables.

FIG. 2 is a drawing showing how to handle the cables.

The cables 28 connected to connectors of the CAs 25 are wired toward a lower part of the disk array system 21 so as to be wired under a floor where the disk array system 21 is installed. Sixteen of the cables 28 are wired from sixteen of the CAs 25 mounted in the upper row of the shelf 27 to the lower part of the disk array system 21. Wiring of the cables 28 of the CAs 25 in the lower row of the shelf 27 is not shown here. Wiring of the cables 28 corresponding to the second CA 25 from the right seen from the front side represents a state of the cables when a cable holder assembly 1 is pivoted. The cable holder assembly 1 clamps four of the cables, so that the four cables 28 move by pivoting the cable holder assembly 1. As a result, none of the cables 28 hangs down over the CM 24 under this CA 25. No cable holder assembly 1 of the other three parts is pivoted here, so that the cables 28 hang down over the CMs 24 as is.

Figure 3:
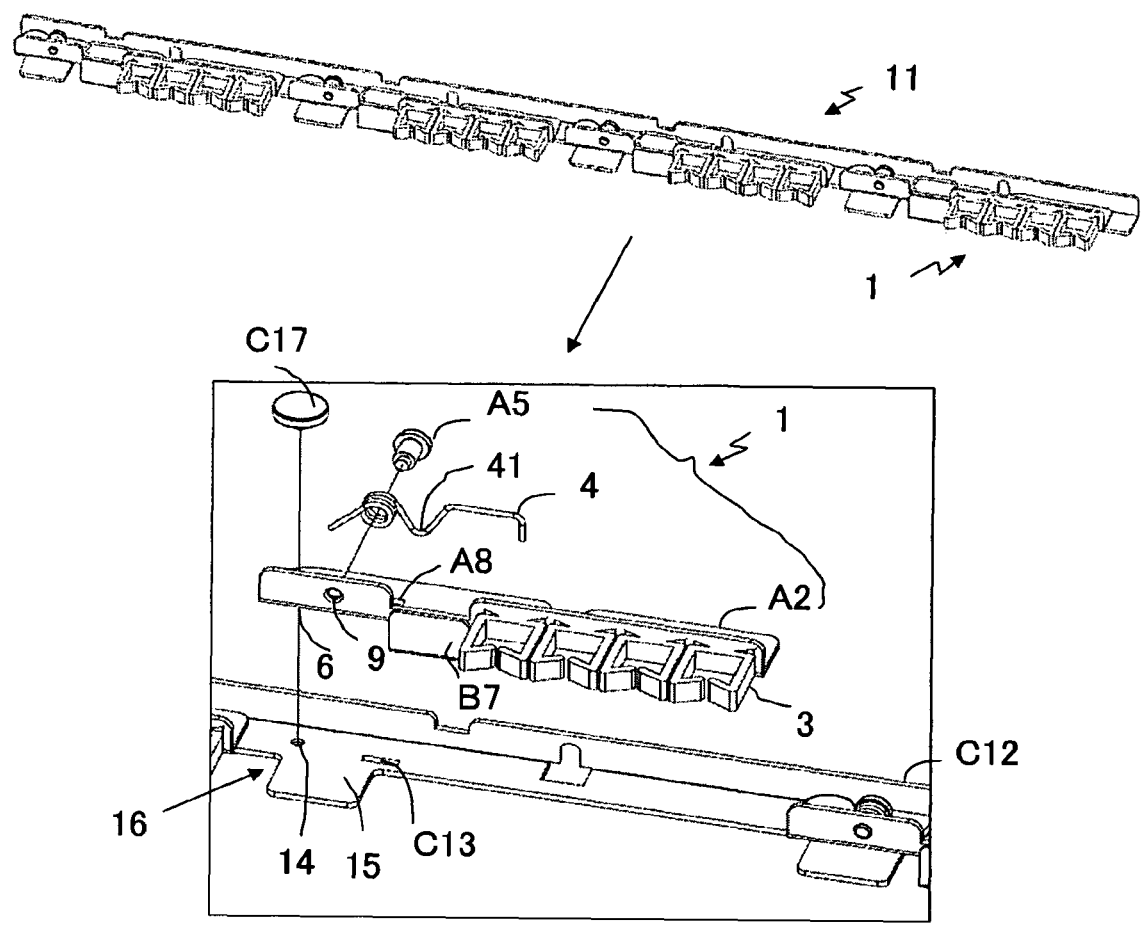
FIG. 3 is a drawing showing a cable holder assembly.

FIG. 3 is a drawing for explaining the cable holder assembly 1.

The disk array system 21 is provided with the cable holder unit 11 for mounting the cables 28 connected to the CAs 25 in the upper row between the upper and lower rows of the shelf 27 for mounting the CAs 25 and the CMs 24. The cable holder unit 11 has four cable holder assemblies 1 and a fitting C12 for mounting them. Each of the cable holder assemblies 1 has a fitting A2, cable clamp holders 3, a coil spring 4, a pin A5, an axial hole 6, a fitting B7, a groove A8 and a hole 9. The cable clamp holders 3, the coil spring 4, the pin A5 and the fitting B7 are mounted in the fitting A2. The fitting A2 is also provided with the axial hole 6, the groove A8 and the hole 9. Each of the cable holders 3 holds one of the cables 28 from a corresponding CA 25 and has four holders. The coil spring 4 is a spring for locking each of the cable holder assemblies 1 to the fitting C12. To that end, the coil spring 1 is adapted so as to insert a V-shaped projecting part 41 thereof into a groove C13 of the fitting C12 by its spring force by penetrating through the groove A8 of the fitting A2. The coil spring 4 is movable and has the sufficient spring force to maintain the V-shaped projecting part 4l in the groove C13 of the fitting C12 until maintenance personnel lift up the coil spring 4 by hand. The spring is also adapted to be anchored by an edge 16 of an anchoring portion 15 of the fitting C12 when the projecting part 41 of the coil spring 4 penetrates through the groove A8 of the fitting A2. A pin A5 fixes the coil spring 4 to the fitting A2. The coil spring 4 is fixed so that it is pivotable counterclockwise seen from the front side of the disk array system 21 when the maintenance personnel lifts up the projecting part 41 of the coil spring 4 from the fitting A2. A pin C17 forming an axis of rotation is inserted into the axial hole 6. A fitting B7 obstructs operation of an ejector lever 29 of the CMs 24. The groove A8 penetrates the V-shaped part of the coil spring 4 through the fitting A2. The hole 9 is a hole for fixing the coil spring 4 to the fitting A2 by means of the pin A5. The fitting C12 of the cable holder unit 11 has the groove C13, a hole for axis of rotation 14, the anchoring portion 15, the edge 16 and the pin C17. The fitting C12 is fixed to the shelf 27. The groove C13 engages with the V-shaped projecting part 41 of the coil spring 4 of the cable holder assembly 1 when the projecting part 41 is inserted therein and stops the cable holder assembly 1 from pivoting. The hole for axis of rotation 14 receives the pin C17 forming the axis of rotation. The pin C17 is fixed to the fitting C12 so that the cable holder assembly 1 is pivotable. The anchoring portion 15 is provided with the edge 16 to stop the cable holder assembly 1 after it has been pivoted. The pin C17 is the axis of rotation for pivoting the cable holder assembly 1 at a fulcrum of the axial hole 6 of the fitting A2.

Figure 4A:
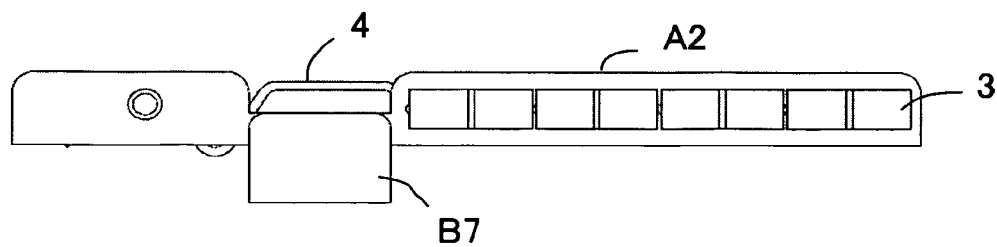
FIGS. 4A, 4B and 4C are, respectively, front, right side and perspective views of the cable holder assembly.
Figure 4B:
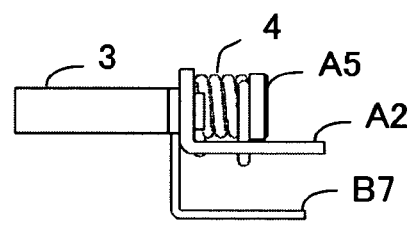
Figure 4C:
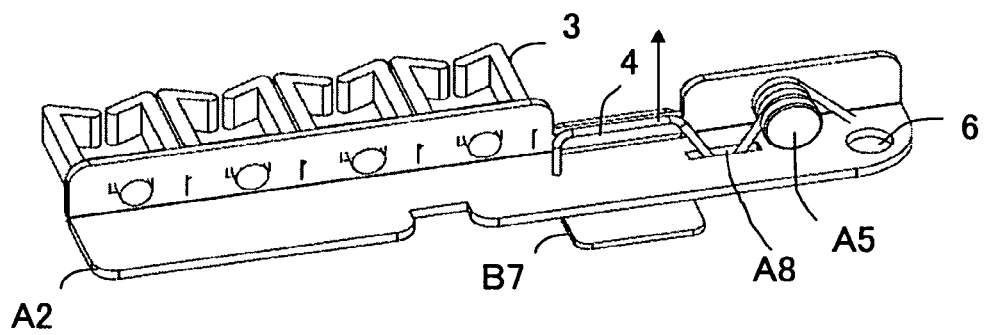

FIGS. 4A, 4B and 4C are front, right side and perspective views of the cable holder assembly 1.

FIG. 4A is a front view of the cable holder assembly 1, i.e., a view showing a side of the cable holder 3 and the fitting B7. The cable holder assembly 1 mounts the cable holders 3 on the fitting A2. FIG. 4B is a right side view of the cable holder assembly 1, wherein the coil spring 4 is fixed by the pin A5 and a right side of the cable holder 3 can be seen. The fitting B7 has an L-shape and part of the L-shape is disposed under the fitting A2. FIG. 4C is a perspective view of the cable holder assembly seen from its backside, wherein the part of the coil spring 4 is inserted into the groove A8 of the fitting A2. When the coil spring 4 enters the groove C13 of the fitting C12 in this state, the cable holder assembly 1 is locked to the fitting C12. Accordingly, lifting up the coil spring 4 in a direction of an arrow releases the coil spring 4 from the groove C13. As a result, the cable holder assembly 1 is unlocked from the fitting C12.

Figure 5A:
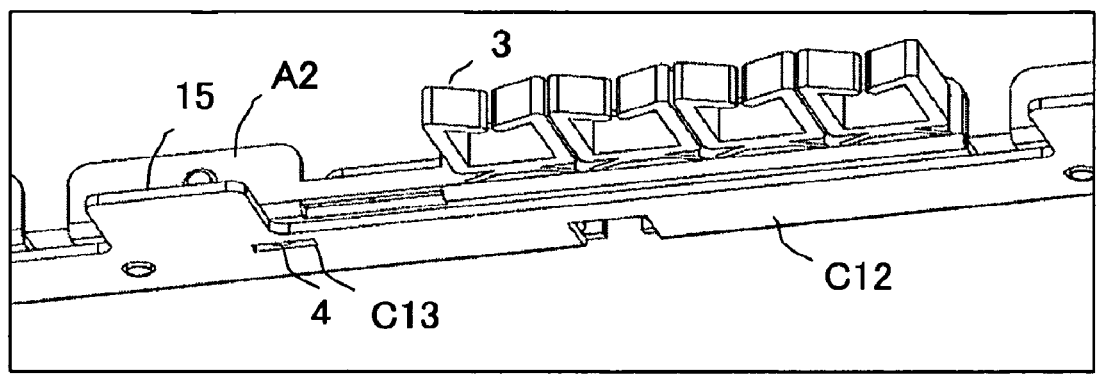
FIGS. 5A and 5B are drawings showing the cable holder assembly before it is pivoted.
Figure 5B:
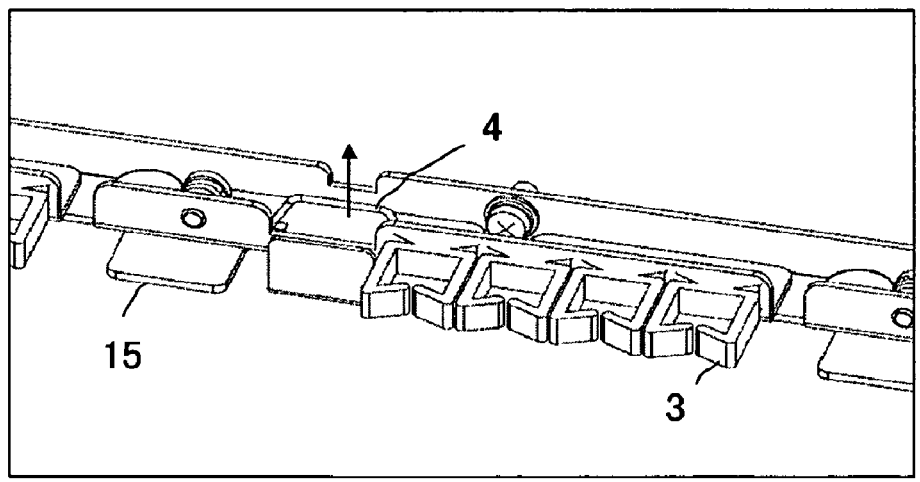

FIGS. 5A and 5B are drawings showing the cable holder assembly 1 before it is pivoted.

Before lifting up the coil spring 4, the coil spring 4 enters the groove A8 of the fitting A2 as well as the groove C13 of the fitting C12 by its spring force and locks the cable holder assembly 1 so as not to pivot (see FIG. 5A). Therefore, in order to pivot the cable holder assembly 1, the coil spring 4 is lifted up first in the direction of the arrow (see FIG. 5B). Then, because the V-shaped projecting part 41 that was in the groove A8 of the fitting A2 as well as the groove C13 of the fitting C12 has been moved above the fitting C12 from the groove C13 by lifting up the part of the coil spring 4, the cable holder assembly 1 is slightly pivoted clockwise in this state. Then, when the part of the lifted-up coil spring 4 is released, the V-shaped projecting part 41 of the coil spring 4 rides on the anchoring portion 15 of the fitting C12.

Figure 6A:
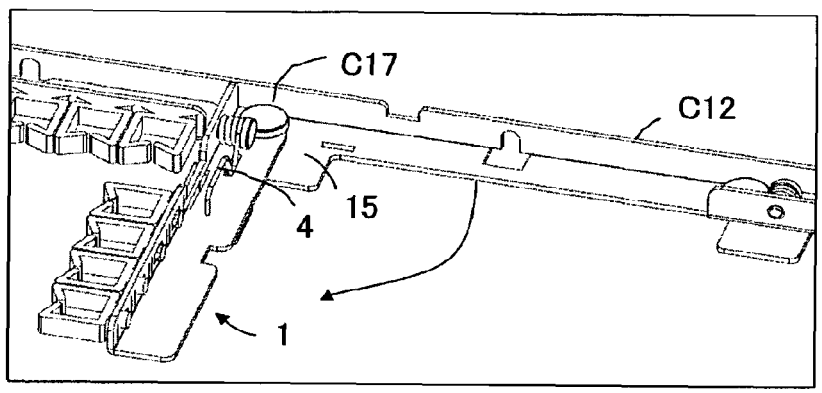
FIGS. 6A and 6B are drawings showing the cable holder assembly after it is pivoted.
Figure 6B:
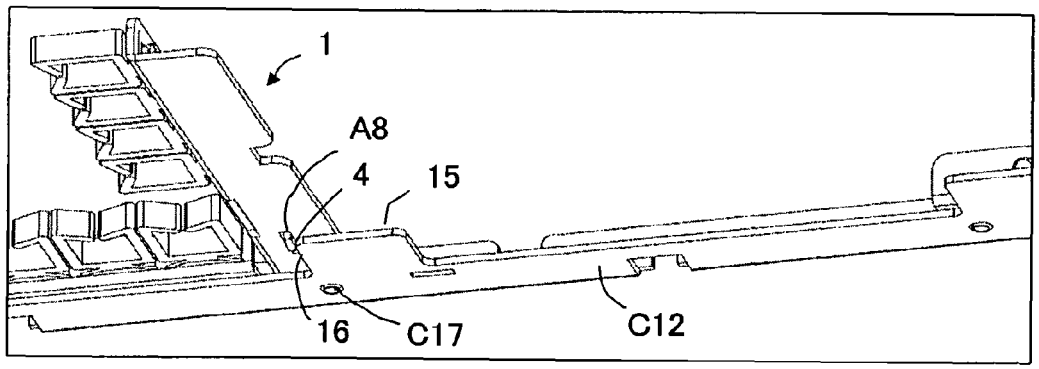

FIGS. 6A and 6B are drawings for explaining the cable holder assembly after it is pivoted.

FIG. 6A shows a state when the cable holder assembly 1 is pivoted in almost 90 degrees clockwise away from the fitting C12 at the fulcrum of the pin C17 from the state shown in FIG. 5B. At this time, the V-shape projecting part 41 of the coil spring 4 rides on the anchoring portion 15 and pivots while in contact with the anchoring portion 15. Then, when the cable holder assembly 1 is pivoted about 90 degrees clockwise away from the fitting C12, the coil spring 4 is released from the anchoring portion 15 and enters a region of the edge 16 of the fitting C12. As a result, the V-shaped projecting part 4l of the coil spring 4 jumps out of the groove A8 of the fitting A2. Therefore, the cable holder assembly 1 cannot be pivoted counterclockwise because the V-shaped projecting part 41 of the coil spring 4 collides against the edge 16 of the anchoring portion 15 of the fitting C12. Accordingly, the open state of the cable holder assembly 1 is maintained (see FIG. 6B). Thus, the interface cables may be effectively moved, so that it becomes easy to exchange the units in the lower row. The invention is applicable not only to the case of configuration of the upper and lower rows but also to a configuration of right and left rows in which the cables 28 are connected from left units by passing through over right units for example.

Figure 7A:
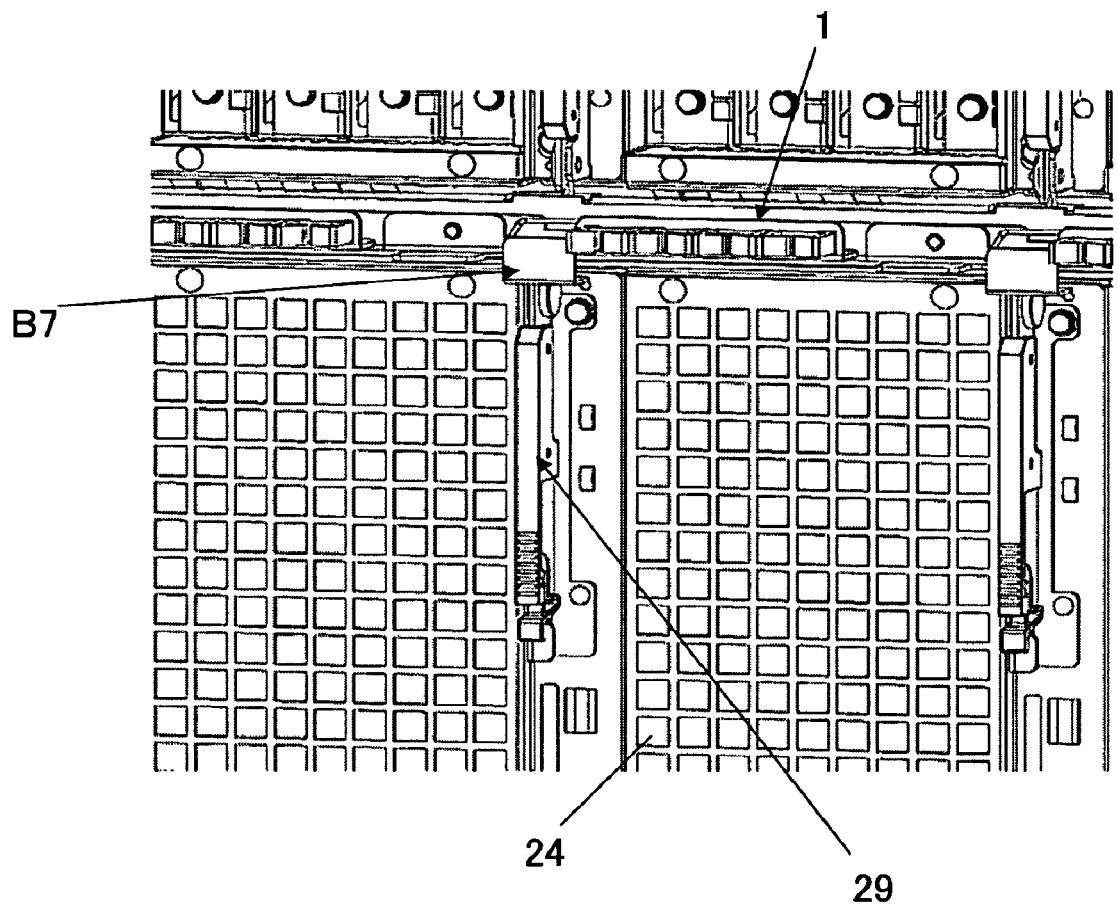
FIGS. 7A and 7B are first drawings showing an erroneous pulling preventing fitting.
Figure 7B:
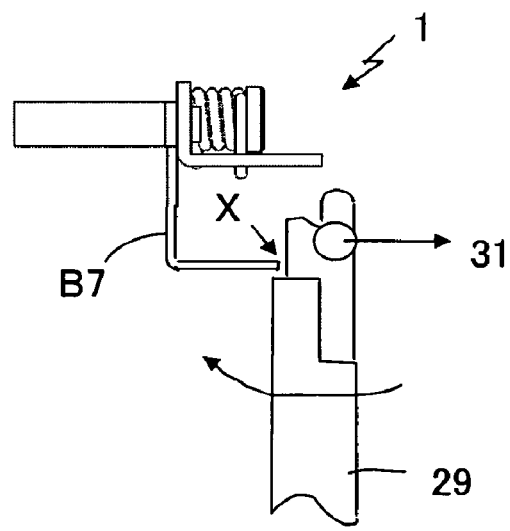

FIGS. 7A and 7B are first drawings for explaining an erroneous pulling preventing fitting.

The fitting B7 of the cable holder assembly 1 obstructs movement of the ejector lever 29 of the CM 24 when the cable holder assembly 1 is closed (see FIG. 7A). FIG. 7B shows a positional relationship between the ejector lever and the fitting B7. This figure shows the positional relationship between the ejector lever 29 and the fitting B7 seen from the right side of the cable holder assembly 1 from the direction of the front side of the disk array system 21. When the ejector lever 29 is urged clockwise in a direction of an arrow based on a fulcrum 31 of the ejector lever 29, an X part of an edge of the L-shaped fitting B7 collides against the ejector lever 29, blocking the ejector lever 29 from pivoting. Therefore, the ejector lever 29 cannot be pivoted. Thus, it prevents operation of the ejector lever 29 for pulling out the CMs 24 in the state when the cables 28 from the CAs 25 hang down. As a result, it becomes possible to prevent the cables 28 from being damaged which would otherwise occur if the CMs 24 were forcibly pulled out without properly handling the cables.

Figure 8A:
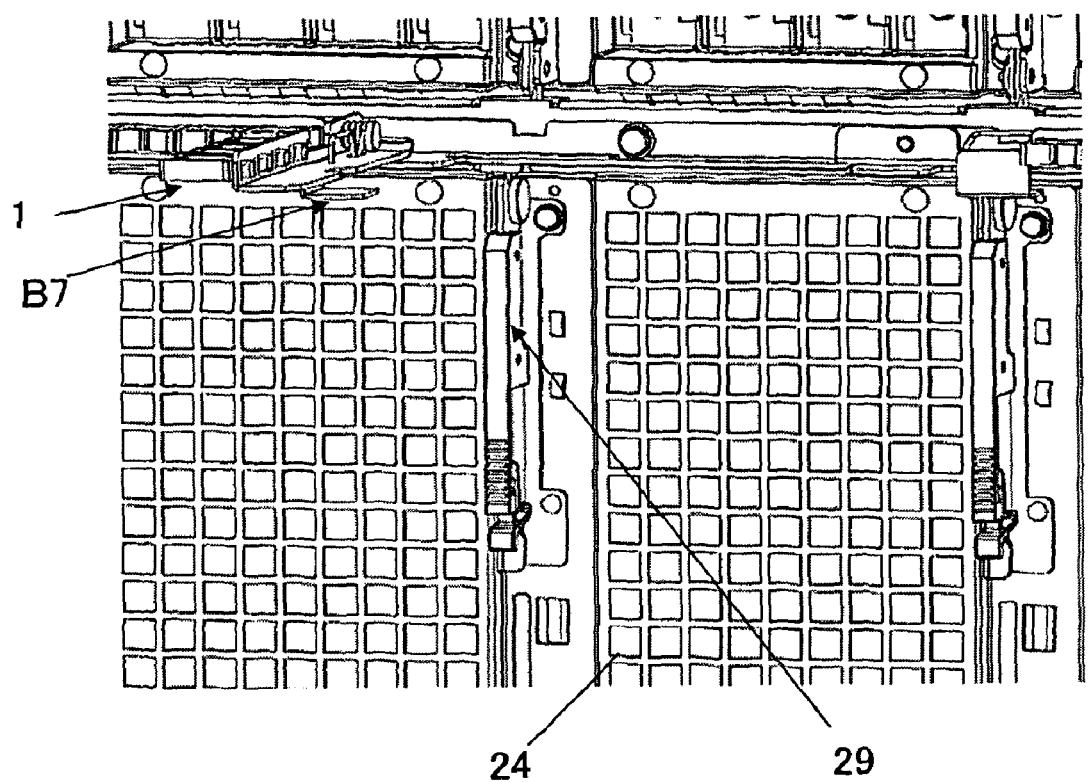
FIGS. 8A and 8B are second drawings showing the erroneous pulling preventing fitting.
Figure 8B:
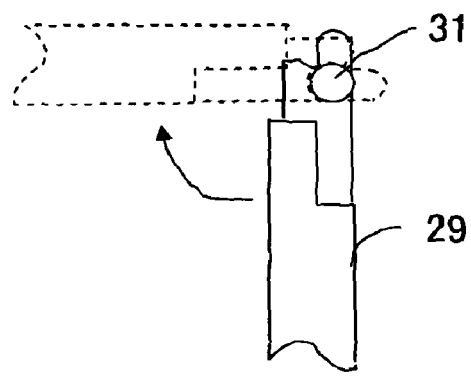

FIGS. 8A and 8B are second drawings for explaining the erroneous pulling preventing fitting.

When the cable holder assembly 1 is being pivoted, the fitting B7 is far from the ejector lever 29 (see FIG. 8A). Therefore, the fitting will not obstruct the operation of the ejector lever 29. As a result, it becomes possible to pull out the CMs 24 because the ejector lever 29 is pivotable (see FIG. 8B).

What is claimed is:

1. An electronic device that mounts a plurality of units connected by cables, comprising:
    first units;
    second units disposed adjacent to said first units;

cables wired from said first units by passing over said second units; and a cable holder unit disposed between said first units and second units, said cable holder unit including:

a cable holder assembly having cable holders holding cables of said first units and a support section supporting said cable holders, said support section having a groove and a movable section, said movable section having a projecting part being inserted into and being penetrated through said groove, and a mounting section mounting said cable holder assembly, said mounting section having a pivoting section enabling said cable holder assembly to pivot and an anchoring section engaging with said projecting part to stop said cable holder assembly from pivoting.

2. The electronic device as set forth in claim 1, wherein said mounting section has a suppressing section suppressing said cable holder assembly from reversely pivoting when the engagement of said cable holder assembly is released by said movable section and said cable holder assembly pivots by a predetermined angle from said mounting section.

3. The electronic device as set forth in claim 1, wherein said cable holder assembly has a preventing section for preventing said second units from being pulled out.

4. The electronic device as set forth in claim 3, wherein said preventing section is an L-shaped fitting.

5. The electronic device as set forth in claim 1, wherein said movable section is a coil spring.

\* \* \* \* \*